(12) United States Patent
Abadeer et al.

(10) Patent No.: US 7,061,308 B2
(45) Date of Patent: Jun. 13, 2006

(54) VOLTAGE DIVIDER FOR INTEGRATED CIRCUITS

(75) Inventors: Wagdi W. Abadeer, Jericho, VT (US);
John A. Fifield, Underhill, VT (US);
William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/605,466

(22) Filed: Oct. 1, 2003

(65) Prior Publication Data
US 2005/0073354 A1  Apr. 7, 2005

(51) Int. Cl.
*G05F 3/02* (2006.01)
(52) U.S. Cl. .................. 327/543; 327/538
(58) Field of Classification Search ........... 327/530, 327/538, 543
See application file for complete search history.

(56) References Cited

U.S. PATENT DOCUMENTS

| | | | |
|---|---|---|---|
| 4,495,651 A | | 1/1985 | Froeliger |
| 4,551,705 A | | 11/1985 | Anderson |
| 4,636,658 A | * | 1/1987 | Arakawa ............... 327/80 |
| 5,485,292 A | * | 1/1996 | Wong et al. ............ 327/56 |
| 5,869,957 A | | 2/1999 | Koike |
| 6,259,612 B1 | * | 7/2001 | Itoh ..................... 363/60 |
| 6,262,469 B1 | * | 7/2001 | Le et al. ............... 257/532 |
| 6,271,717 B1 | * | 8/2001 | Houghton et al. ........ 327/538 |
| 6,373,328 B1 | * | 4/2002 | Rapp .................... 327/536 |
| 6,518,814 B1 | * | 2/2003 | Majid et al. ............ 327/306 |
| 6,552,886 B1 | * | 4/2003 | Wu et al. ............... 361/56 |
| 6,737,912 B1 | * | 5/2004 | Otsuka .................. 327/566 |
| 6,841,982 B1 | * | 1/2005 | Tran ..................... 323/316 |
| 6,842,379 B1 | * | 1/2005 | Toros et al. .......... 365/185.22 |
| 6,867,633 B1 | * | 3/2005 | Godat ................... 327/306 |
| 2005/0030702 A1 | * | 2/2005 | Diorio et al. ........... 361/328 |

OTHER PUBLICATIONS

*A Low Cost Voltage Controlled Amplifier*; Mr. P.V. Wilson, Electronics Australia, vol. 43, No. 1, Jan., 1981; pp. 1 and 73.

* cited by examiner

*Primary Examiner*—Terry D. Cunningham
(74) *Attorney, Agent, or Firm*—Downs Rachlin Martin PLLC (57) ABSTRACT

A voltage divider for integrated circuits that does not include the use of resistors. In one embodiment, voltage node VDD is connected with two n-type transistors, NFET1 and NFET2, which are connected in series. NFET 1 includes a source (12), a drain (14), a gate electrode (16) having a gate area A1 (not shown), and a p-substrate (18). NFET2 includes a source (20), a drain (22), a gate electrode (24) having a gate area A2 (not shown), and a p-substrate (26). Source (12) and drain (14) of NFET1 are coupled with gate electrode (24) of NFET2. The voltage difference between NFET1 and NFET2 has a linear function with VDD. As a result, voltage VDD may be divided between NFET1 and NFET2 by properly choosing the ratio between each of the respective transistor gate electrode areas, (A1) and (A2).

2 Claims, 11 Drawing Sheets

VOLTAGE DIVIDER FOR INTEGRATED CIRCUITS

BACKGROUND OF INVENTION

1. Field of the Invention

The present invention relates to a voltage divider for an integrated circuit, and in particular to a voltage divider for an integrated circuit that does not include the use of resistors.

2. Background of the Invention

Voltage dividers are often used in integrated circuits to supply a voltage different from that of an available power source. Typically, voltage dividers in integrated circuits are designed using resistors. The most commonly utilized type of resistor in voltage dividers formed on a semiconductor substrate is the P+ poly resistor formed from polysilicon.

The use of resistors in voltage dividers has known drawbacks. It is often difficult to form resistors with high resistance when using poly-silicon. Poly-silicon resistors often require a large surface area. As a result, typical resistance values are in the range of 200–300 K Ohms. In addition, when using poly-silicon, the manufacturing process must be altered or require additional processing or masking steps to change the voltage values of the voltage divider. Further, poly-silicon resistors often have high tolerances and high temperature coefficients.

The use of transistors to divide voltage is also known in the art. However, prior art use of transistors typically requires the use of many transistors. In addition, prior art voltage division using transistors has typically failed to yield accurate and predictable results.

SUMMARY OF INVENTION

One aspect of the present invention is a voltage divider circuit coupled to a power source having a source voltage and a ground. The voltage divider circuit includes the following: a first transistor including a gate electrode having an area, a source, and a drain; and a second transistor including a gate electrode having an area, a source, and a drain, wherein the second transistor gate electrode is joined with the first transistor source and the first transistor drain. The first transistor gate electrode area and the second transistor gate electrode area differ by a margin greater than a typical manufacturing tolerance for transistor gate electrode areas.

Another aspect of the present invention is a voltage divider circuit coupled to a power source having a source voltage and a ground. The voltage divider circuit includes the following: a first transistor including a gate electrode having an area, a source, and a drain; and a second transistor including a gate electrode having an area, a source, and a drain, wherein the second transistor gate electrode is joined with the first transistor source and the first transistor drain. The first transistor gate electrode area and the second transistor gate electrode area differ by a margin greater than a typical manufacturing tolerance for transistor gate electrode areas and the first and second transistor gate electrode areas are selected to provide a desired division of the source voltage.

Still another aspect of the present invention is a method of dividing a power source voltage including the following steps: providing a voltage divider circuit having a first transistor including a first transistor gate electrode having a first transistor gate electrode area and a second transistor including a second transistor gate electrode having a second transistor gate electrode area; applying the power source voltage to the voltage divider circuit; and dividing the power source voltage according to the ratio of the first transistor gate electrode area to the second transistor gate electrode area.

Another aspect of the present invention is a voltage divider circuit coupled to a power source having a power source voltage and a ground. The voltage divider circuit includes the following: a plurality of transistors, each including a gate electrode having a gate electrode area, a source, and a drain. The source and drain of each of the plurality of transistors is joined with the gate electrode of another of the plurality of transistors and the gate electrode areas are equal.

Yet another aspect of the present invention is a method of designing a circuit for dividing voltage including the following steps: providing a first transistor including a gate electrode having an area, a source, and a drain; providing a second transistor including a gate electrode having an area, a source, and a drain; selecting the first transistor gate electrode area and the second transistor gate electrode area according to a predetermined ratio between the areas to provide a desired voltage division; and joining the second transistor gate electrode with the first transistor source and the first transistor drain.

Other features, utilities and advantages of various embodiments of the invention will be apparent from the following more particular description of embodiments of the invention as illustrated in the accompanying drawings.

BRIEF DESCRIPTION OF DRAWINGS

For the purpose of illustrating the invention, the drawings show a form of the invention that is presently preferred. However, it should be understood that the present invention is not limited to the precise arrangements and instrumentalities shown in the drawings, wherein.

DETAILED DESCRIPTION

The present invention is a voltage divider for integrated circuits that does not include the use of resistors. The following provides a detailed description of drawings illustrating various embodiments of the present invention. Like elements have like element numbers.

Figure 1:
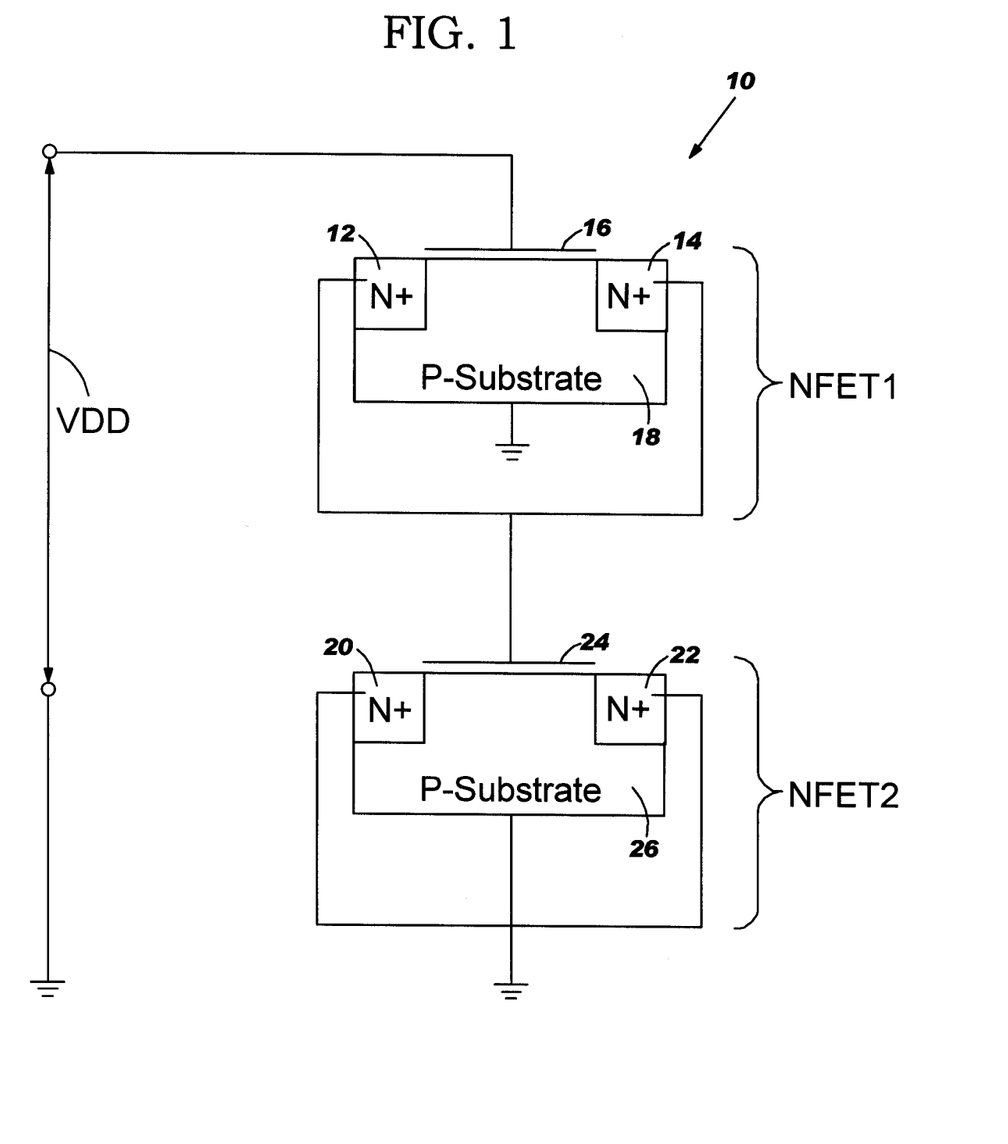
FIG. 1 is a circuit diagram including a voltage divider according to one embodiment of the present invention.

Referring now to the drawings, FIG. 1 illustrates a diagram of a voltage divider circuit 10 according to one embodiment of the present invention. Voltage node VDD is connected with two n-type transistors, NFET1 and NFET2, which are connected in series. NFET1 includes a source 12, a drain 14, a gate electrode 16 having a gate area A1 (not shown), and a p-substrate 18. NFET2 includes a source 20, a drain 22, a gate electrode 24 having a gate area A2 (not shown), and a p-substrate 26. Source 12 and drain 14 of NFET1 are coupled with gate electrode 24 of NFET2. Although the embodiments of the present invention illustrate the use of NFETs, as one skilled in the art will appreciate, the present invention also includes the use of PFETs.

The voltage difference between NFET1 and NFET2 has a linear function with VDD. As a result, voltage VDD may be divided between NFET1 and NFET2 by properly choosing the ratio between each of the respective transistor gate electrode areas, A1 and A2. Although A1 and A2 will differ slightly according to respective manufacturing tolerance, the present invention contemplates those instances where the margin between A1 and A2 is greater than the manufacturing tolerances according to a predetermined ratio.

The following design equations establish the relationship between A1 and A2. The equations may be used to design a voltage divider circuit according to the present invention. The voltage across NFET1, i.e., A1, is represented by V1 and the voltage across NFET2, i.e., A2, is represented by V2. The voltage difference between V1 and V2 is represented by ÄV and the ratio V1/V2 is represented by VR. As follows:

$V1+V2=VDD$ (1)

$V1-V2=\Delta V$ (2)

$V1=(VDD+\Delta V)/2$ (3)

$V2=(VDD-\Delta V)/2$ (4)

$V1/V2=VR=(VDD+\Delta V)/(VDD-\Delta V)$ (5)

$\Delta V=VDD\times(VR-1)/(VR+1)$ (6)

$V1=VDD\times VR/(VR+1)$ (7)

$R=A2/A1$ (8)

$\Delta V/VDD=(VR-1)/(VR+1)$ (9)

DESIGN EXAMPLE

Figure 2:
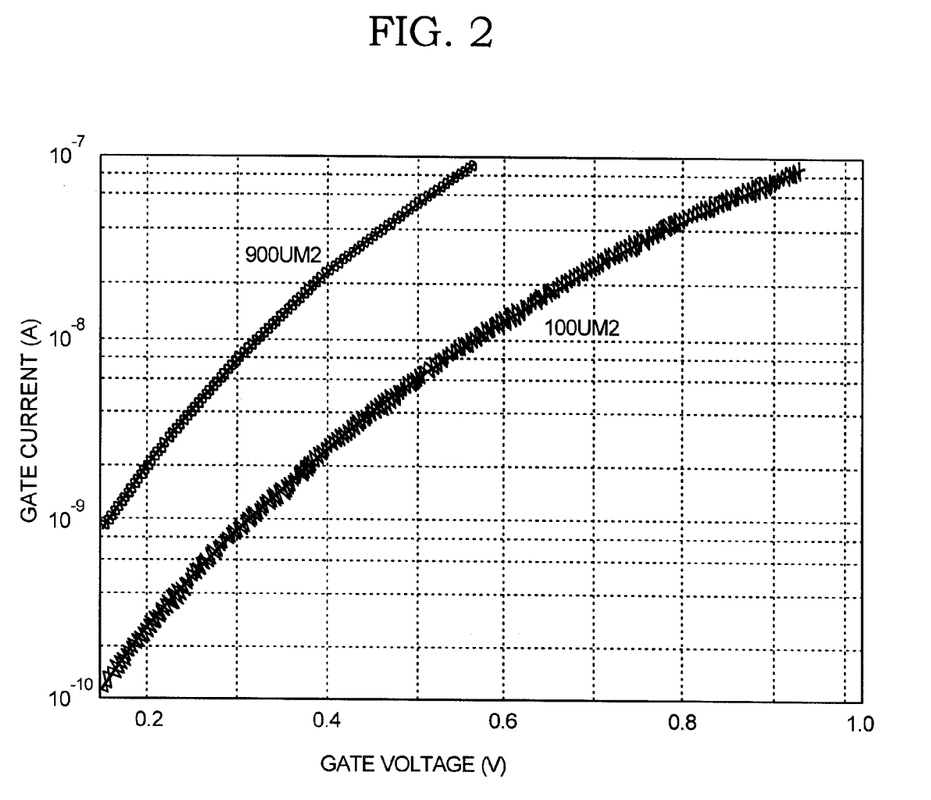
FIG. 2 is a chart of gate currents versus gate voltages for a design example according to the circuit illustrated in FIG. 1.
Figure 3:
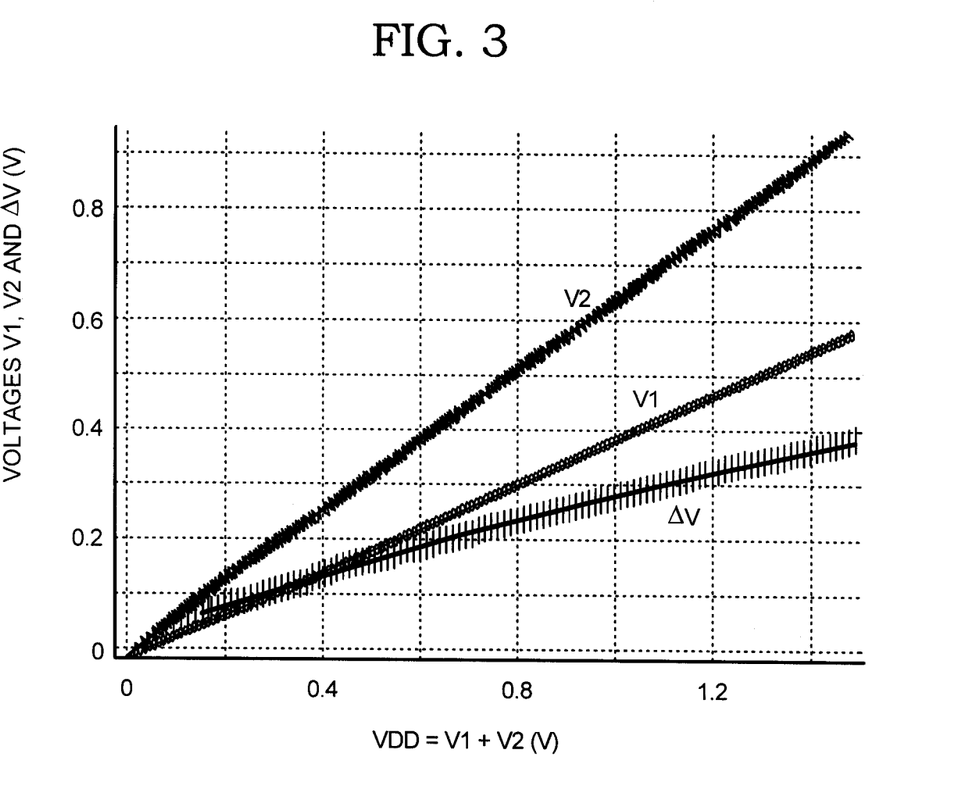
FIG. 3 is a chart of the measured V1, V2, and ΔV values for a design example according to the circuit illustrated in FIG. 1.
Figure 4:
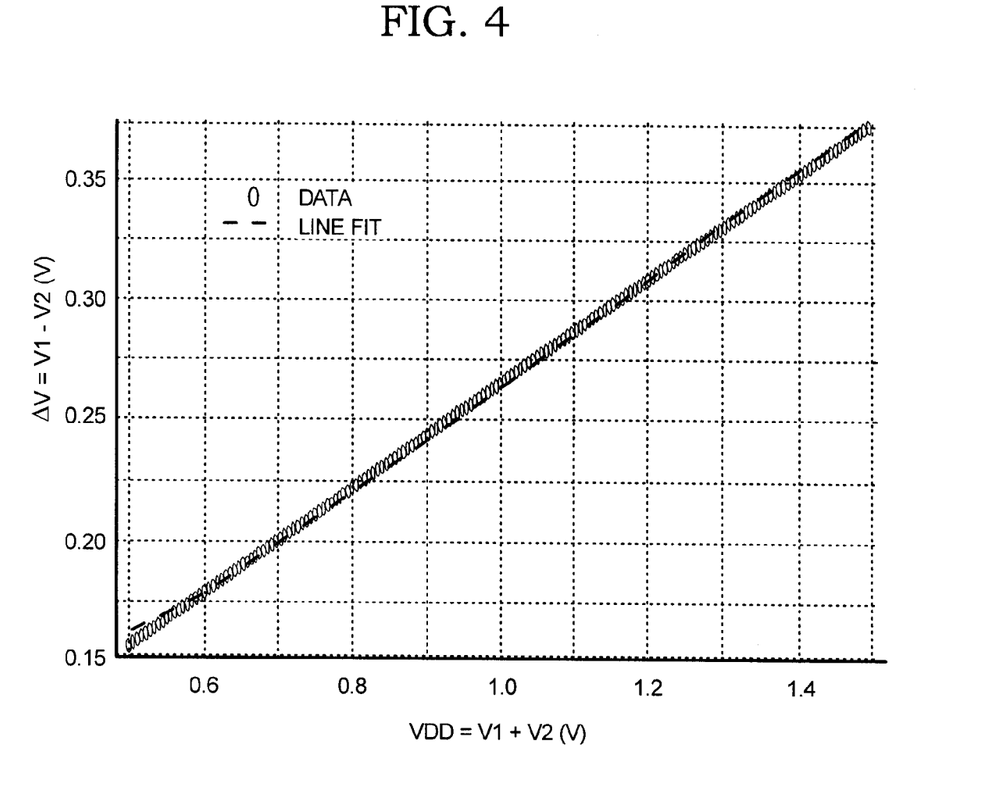
FIG. 4 is a chart of the linearity of ΔV versus VDD for a design example according to the circuit illustrated in FIG. 1.

The following example is presented to demonstrate the design equations established above. Using the following design criteria: A1=100 μm², A2=900 μm², R=9; oxide thickness=1.95 nm (as measured by electrical measurements); and range of VDD=0 to 1.5V, FIGS. 2–4 illustrate measured values for the above-referenced example. Referring now to FIG. 2, the gate currents versus the gate voltages for NFET1 and NFET2 are illustrated. FIG. 3 is a chart of the measured V1, V2, and ΔV versus VDD at 27° C. FIG. 4 shows the linearity of ΔV versus VDD, at less than a 4% deviation above 0.2V.

The gate currents of NFET1 and NFET2 as a function of their respective gate voltages are tunneling currents where the gate current density (e.g. in A/mm² of oxide area), is a strong function of gate oxide thickness. The gate tunneling current is directly proportional to the oxide area, as is evident in FIG. 2 when comparing the gate currents of the two transistors with different oxide areas. As shown in FIG. 1, transistors NFET1 and NFET2 are connected in series, thus the current passing through is the same. Accordingly, the voltages across transistors V1 and V2 will be different as shown in FIG. 3 and the voltage difference between V1 and V2 is ΔV. Transistors NFET1 and NFET2 of FIG. 1 behave as resistors in terms of performing the function of voltage division. As shown in FIG. 4, the difference between voltages V1 and V2, i.e., ΔV is very close to a perfect linear function of the supply voltage VDD and behaves similar to resistors.

As follows, to a first degree of fit, as a first iteration, the relationship between voltage and current for NFET1 and NFET2 of the design example may be expressed as:

$I1=D1\times V1^{C1}$ and $I2=D2\times V2^{C2}$ (10)

Figure 5:
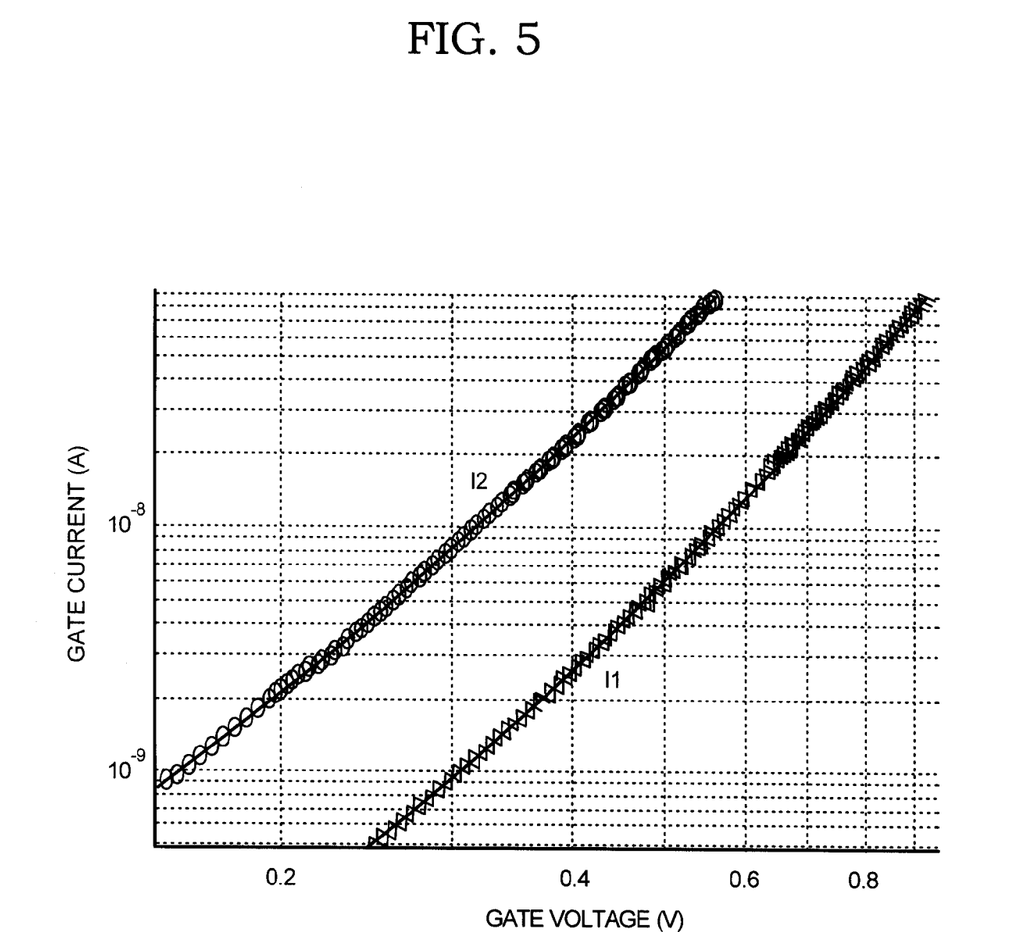
FIG. 5 is a chart of Log(I) versus Log(V) for a design example according to the circuit illustrated in FIG. 1.

D1 and D2 are constants. I1 and I2 in expression (10) represent a power law relationship. Referring now to FIG. 5, the relationship in expression (10) is illustrated as Log (I) versus Log (V) for NFET1 and NFET 2 with the value of C1=3.5177. From expression (9), with I1=I2, because the transistors are connected in series, the following expressions are obtained in a first iteration:

$V1/VDD=K1=R^{B1}/(1+R^{B1})$ (11)

$V2/VDD=K1/R^{B1}$ (12)

$VR=V1/V2=R^{B1}$ (13)

where B1=1/C1=0.2843. Thus for the design example stated above, as a first iteration, with R=9, VR=1.8676 and S=ΔV/VDD=0.3026. Note that when A1=A2, i.e., R=1, V1=V2 and voltage VDD is equally divided between V1 and V2.

The above example was demonstrated with a first degree of approximation using a power law fit for the relationship between I and V for NFET1 and NFET2. The following expression takes into account the complex relationship between I and V, which allows the I/V functions illustrated in FIG. 2 to be expressed with a high degree of fit:

$$Log(I)=\sum_{n=0}^{n}[cn\times(Log(V))^n]$$ (14)

Figure 6:
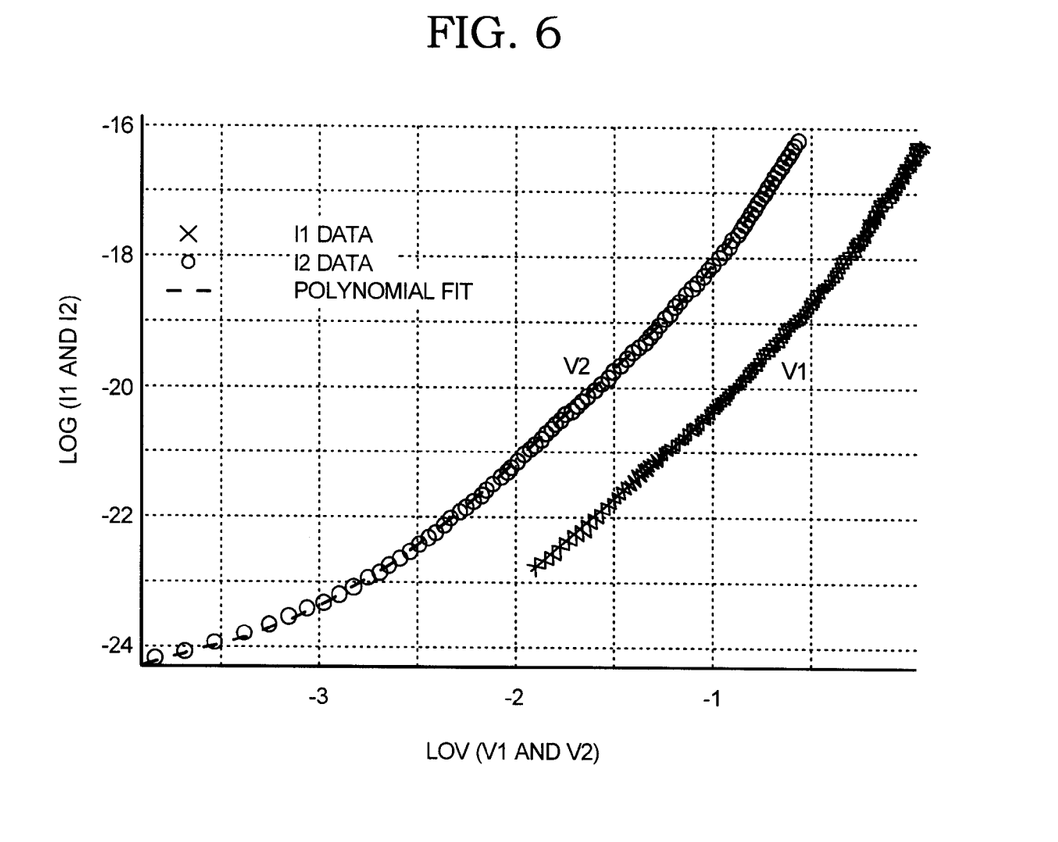
FIG. 6 is a chart of Log(I) and Log(V) versus a $5^{th}$ degree polynomial fit for a design example according to the circuit illustrated in FIG. 1.

Referring now to FIG. 6, using expression (14), the Log of currents I1 and I2 versus the Log of voltages V1 and V2, respectively, for the above-mentioned design criteria, are illustrated. FIG. 6 provides a 5$^{th}$ degree polynomial fit with a deviation between data and fit less than 3.5%. As follows, the polynomial fit in FIG. 6 is represented by the following expression:

$Log(I2)=-13.387+[6.1434\times Log(V2)]+[2.6286\times\{Log(V2)\}^2]$

+

$[1.3483\times\{Log(V2)\}^3]+[0.37073\times\{Log(V2)\}^4]+[0.036284\times\{Log(V2)\}^5]$ (15)

Because I1=I2, the following is obtained:

Log(*I*1)=−13.387−{Log(*R*)}+[6.1434×Log(*V*1)]+
    [2.6286×{Log(*V*1)}$^2$]

+

[1.3483×{Log(*V*1)}$^3$]+[0.37073×{Log(*V*1)}$^4$]+
    [0.036284×{Log(*V*1)}$^5$]     (16)

The polynomial fit illustrated in FIG. 6 and represented by expression (15) is valid for V10.14V and V2>0.02V. Next, to obtain the precise design value of R, i.e., A2/A1, for a given VR, i.e., V1/V2, the following steps are taken. First, the left hand side of expressions (15) and (16) are equal with I1=I2, as NFET1 and NFET2 are in series.

The relationship between gate tunneling current and gate voltage for transistors NFET1 and NFET2, as shown in FIG. 2, is highly non-linear. In order to accurately and analytically determine the design parameters for the voltage divider circuit, one needs to establish an analytical expression relating the gate tunneling current to the gate voltage. To accomplish this task, two approaches with different objectives are demonstrated. The first approach is for simplicity and ease of application without compromising accuracy by more than 5%. The second approach is a more rigorous procedure and provides a higher degree of accuracy. In FIG. 5, the first approach is demonstrated by approximating the relationship between tunneling current and gate voltage with a power law relationship. FIG. 6 demonstrates the second approach where a 5th degree polynomial fit to data is utilized to accurately model the relationship between Log V and Log I.

Then, V1/VR is substituted for V2 in the left hand side of expression (16) and expression (7) is substituted for V1, thereby expressing V1 in terms of VDD and VR. Thus, for a given value of VDD, the only unknown in expressions (15) and (16) is the area ratio R. As follows:

[6.1434×Log(*V*2)]+[2.6286×{Log(*V*2)}$^2$]+[1.3483×
    {Log(*V*2)}$^3$]

[0.37073×{Log(*V*2)}$^4$]+[0.036284×{Log(*V*2)}$^5$]

+

{Log *R*}−[6.1434×Log(*V*1)]−[2.6286×{Log(*V*1)}$^2$]−
    [1.3483×{Log(*V*1)}$^3$]

−

[0.37073×{Log(*V*1)}$^4$]−[0.036284×{Log(*V*1)}$^5$]=0     (17)

Figure 7:
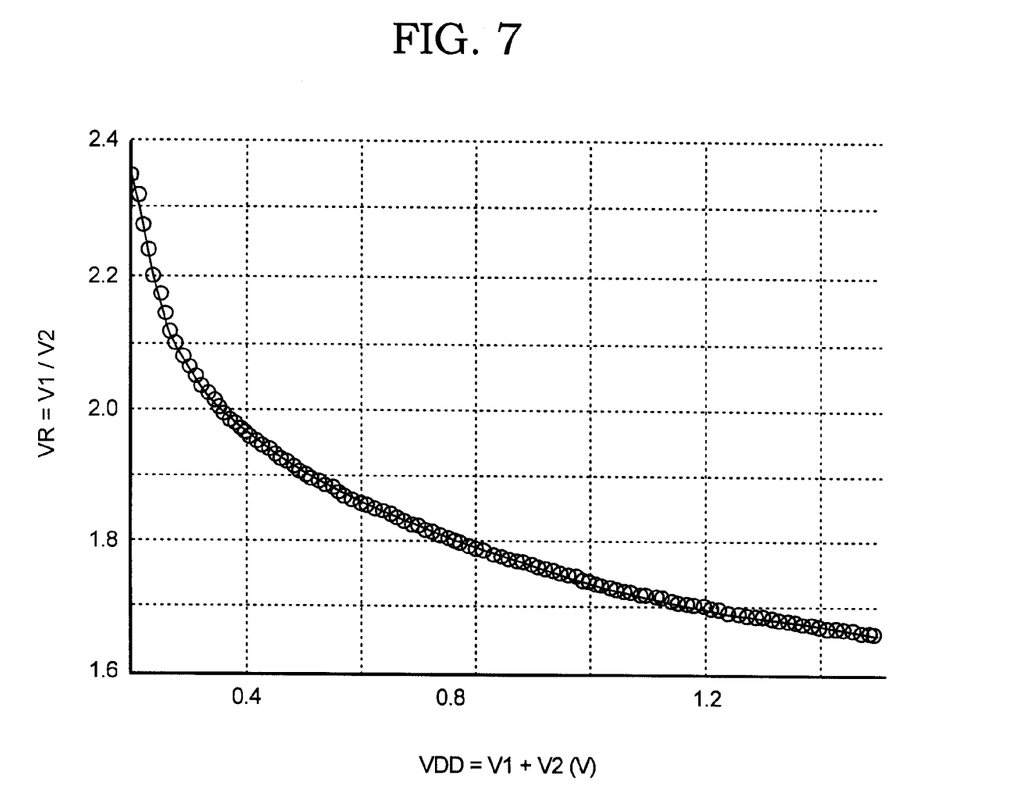
FIG. 7 is a chart of VR=V1/V2 versus VDD for R=9 and for a design example according to the circuit illustrated in FIG. 1.

Considering V1=VDD×VR/(VR+1) and V2=VDD/(VR+1), expression (17) may be alternatively expressed as follows:

F(R, VDD, VR)=0     (18)

where F represents the function on the left hand side of expression (17). To solve expression (18) for VR, a desired value is assigned to VDD and R. In the example here, VDD=0.8V and R=9. Referring now to FIG. 7, the corresponding solution of expression (18) is illustrated as VDD versus VR. From FIG. 7, VR=1.789 at VDD=0.8V. Comparing this exact value for VR with that obtained from the approximate procedure of first iteration, the difference is slightly less than 5%.

Figure 8:
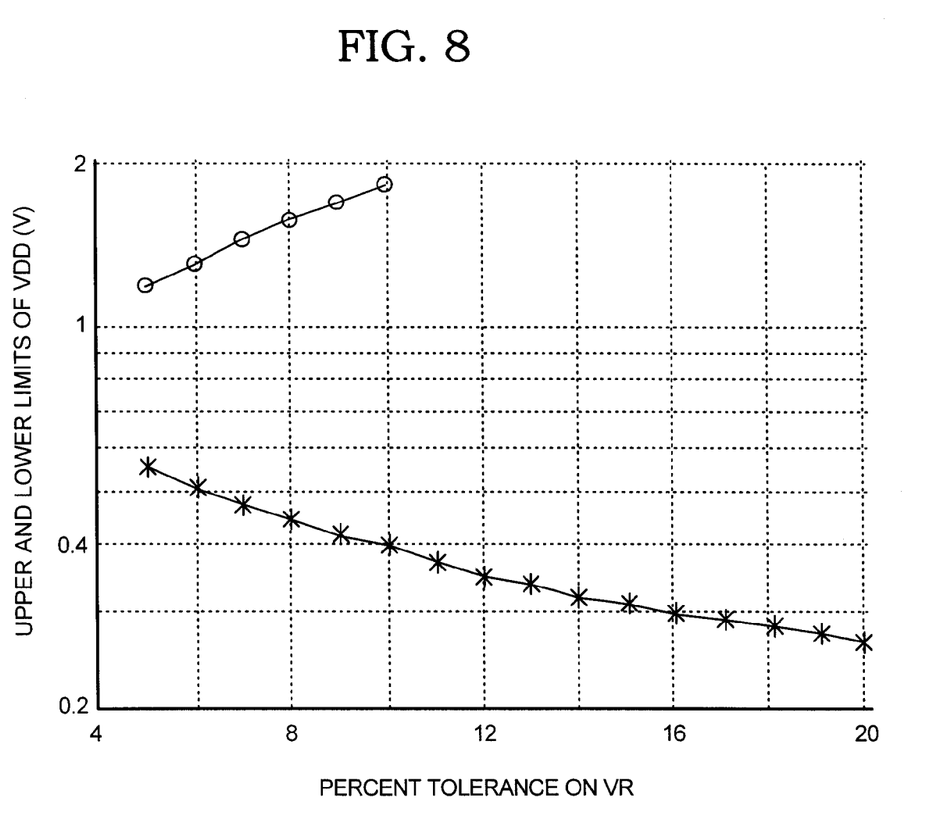
FIG. 8 is a chart of the upper and lower limits of VDD to meet required tolerances on VR for a design example according to the circuit illustrated in FIG. 1.
Figure 9:
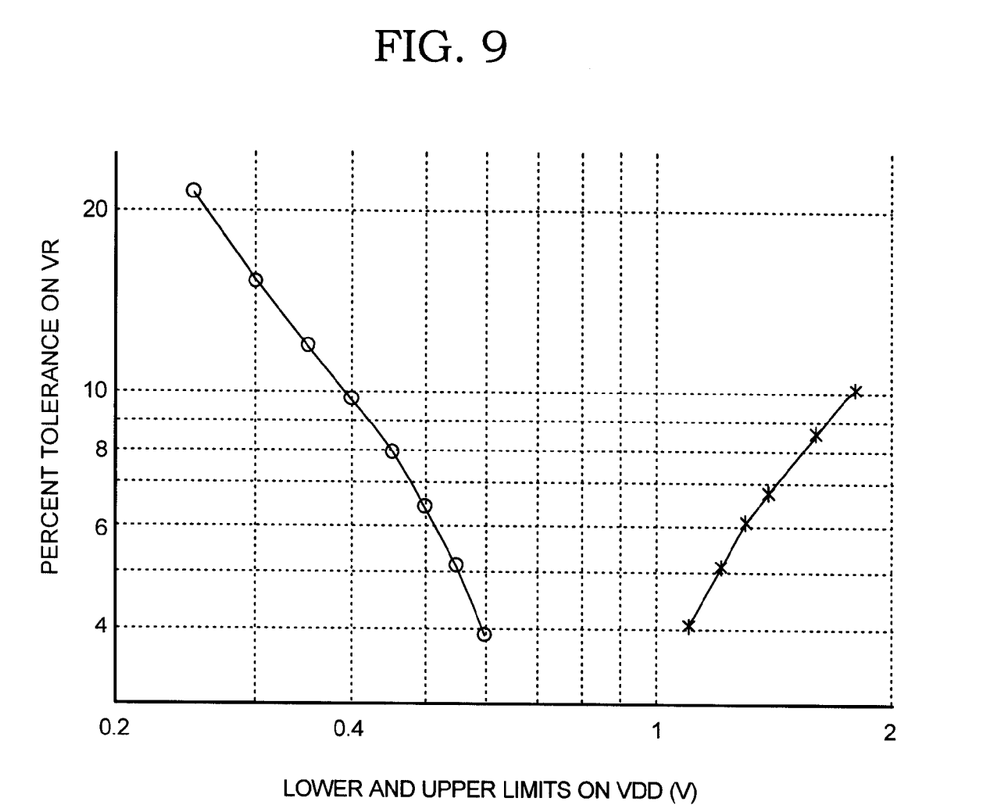
FIG. 9 is a chart of the percent tolerance on VR to meet required upper and lower limits of VDD for a design example according to the circuit illustrated in FIG. 1.

Depending on the design requirements, expression (18) may be solved either for a range of VDD where a desired % tolerance for VR is known or for a % tolerance for VR where a range of VDD is known. FIG. 8 illustrates the former and FIG. 9 illustrates the latter. In FIG. 8 and FIG. 9, the design values are R=9, VDD=0.8V, and VR=1.789. In FIG. 8, for the design case of R=9, VR=1.789, and VDD=0.8V, the upper limit on VDD is approximately 1.8V at the lower 10% tolerance limit of VR. In FIG. 9, where VDD=0.8V, VR=1.789, and R=9, an upper tolerance limit of approximately 21.5% on VR will result to meet a lower limit on VDD of 0.25V, and a lower limit tolerance on VR of approximately 10% will result to meet an upper limit on VDD of about 1.8V.

Figure 10:
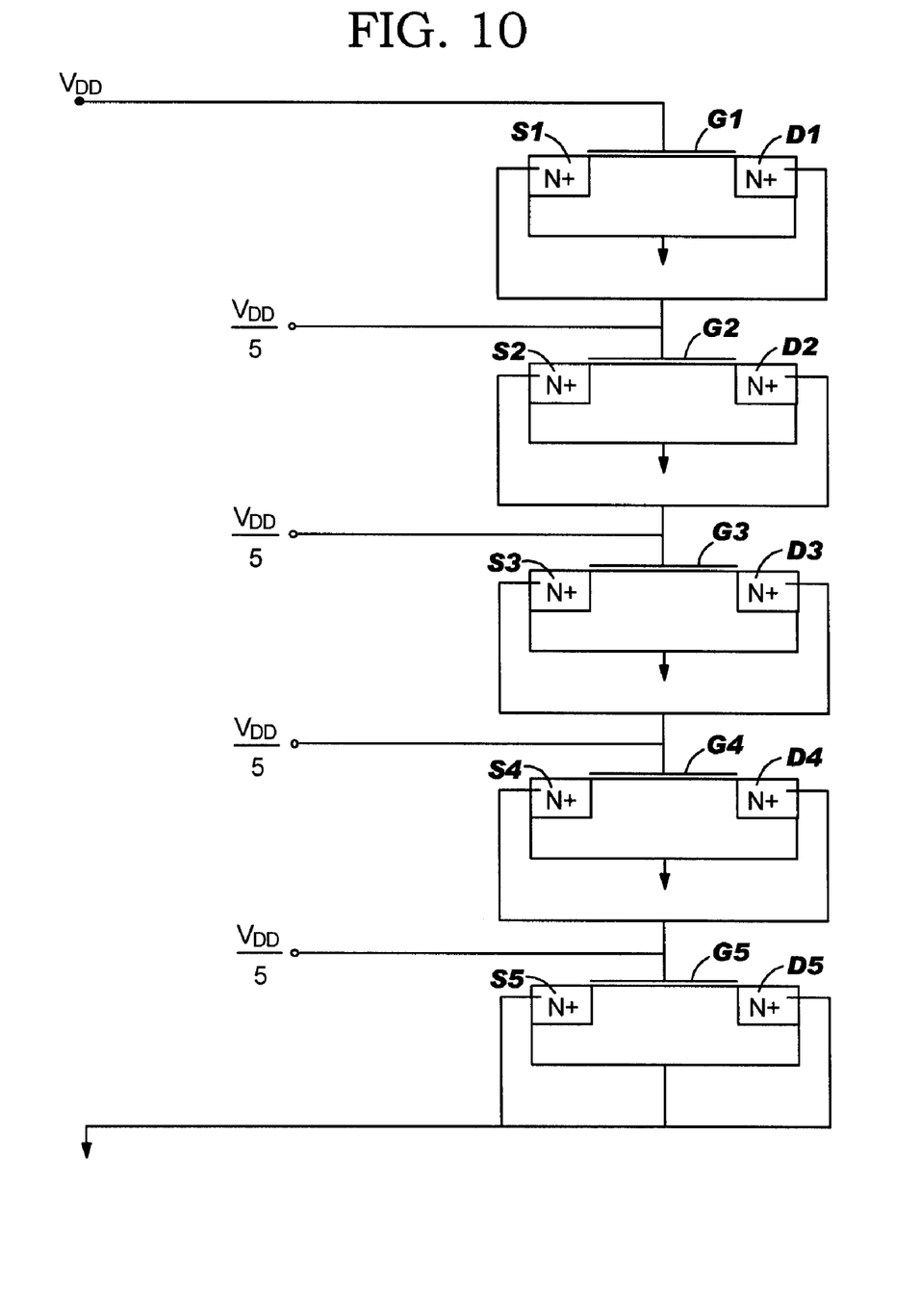
FIG. 10 is a circuit diagram including a voltage divider according to one embodiment of the present invention where all transistor gate electrode areas are equal.

Referring now to FIG. 10, in another embodiment of the present invention, the VDD supply is connected to a series of NFETs, i.e., NFET1, NFET2, . . . , NFETn, having equal gate electrode areas (A1 . . . An, respectively). Gate G1 of the first NFET, i.e., NFET1 is joined with VDD. The source S and drain D for each intermediate NFET is connected to the gate electrode G of the subsequent transistor in the series. Source S5 and drain D5 of the last NFET are joined with the ground. Because all of the transistors have equal gate electrode areas, i.e. A1=A2=An, VDD will be equally divided between each transistor. Using the scheme illustrated in FIG. 10, the voltage value at each gate electrode G depends on the number of transistors included in the circuit. Connecting NFETs serially in this scheme will cause the voltage across each NFET, i.e., between the gate electrode G and the diffusions, to be a small fraction of VDD. In some configurations, the voltage across each NFET may approach zero, e.g., 100 mV for VDD of 1.0V and ten transistors connected serially. Normally, a low voltage causes a loss of surface inversion for an NFET. Surface inversion is generally required to maintain a predictable gate electrode current and to achieve a desired voltage division. To overcome the problems associated with low voltages, type zero threshold voltage NFETs are utilized. With zero threshold voltage NFETs, which are commonly used, surface inversion is maintained even where the gate electrode voltage is zero.

Figure 11:
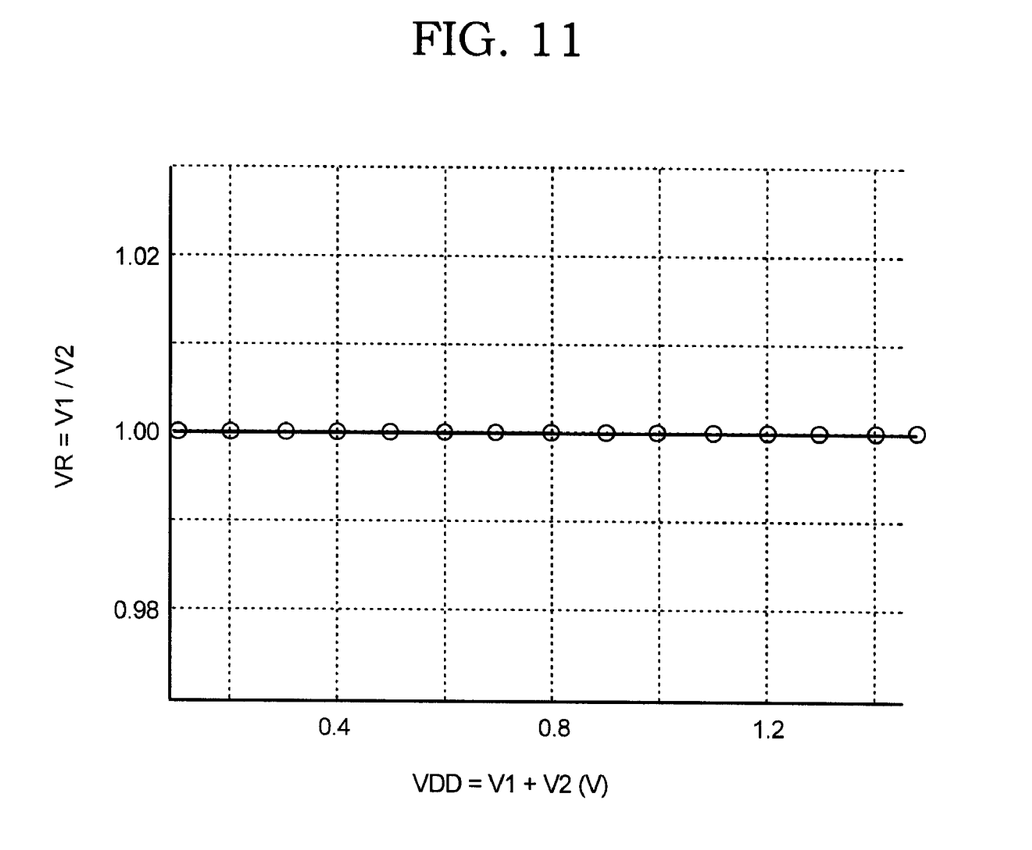
FIG. 11 is a chart of VR=V1/V2 versus VDD for R=9 and for a design example with two transistors having equal gate electrode areas arranged in series.

The alternative embodiment illustrated in FIG. 10 provides a constant ratio between the voltage at each gate electrode G and VDD independent of the power supply tolerances. Referring now to FIG. 11, VDD versus VR is illustrated for two NFETs connected in series according to the scheme illustrated in FIG. 10. As explained above, VR is constant along the range of VDD.

The voltage divider circuit according to the present invention allows voltage to be precisely divided without the use of resistor elements. In one embodiment, two NFETs connected in series and having different gate electrode areas, A1 and A2, are connected to a supply source VDD. The voltage difference between the two transistors has a linear function with VDD, and the voltage VDD is divided between the two NFETs to any desired ratio by properly choosing the ratio between A1 and A2. A voltage divider circuit according to the present invention has a low temperature coefficient, i.e., approximately 3% over the range of 0° C. to 105° C. In addition, there is no minimum area requirement for the gate electrode area A.

While the present invention has been described in connection with specified embodiments, it will be understood that it is not so limited. On the contrary, it is intended to cover all alternatives, modifications and equivalents as may be included within the spirit and scope of the invention as defined in the appended claims.

The invention claimed is:

1. A method of dividing a power source voltage comprising the steps of:
   providing a voltage divider circuit having a first transistor including a first transistor gate electrode having a first transistor gate electrode area and a second transistor including a second transistor gate electrode having a second transistor gate electrode area;
applying the power source voltage to said voltage divider circuit; and
dividing the power source voltage according to the ratio of said first transistor gate electrode area to said second transistor gate electrode area, wherein said ratio is calculated using the following non-linear function solved by numerical iteration $$[6.1434 \times \text{Log}(V2)] + [2.6286 \times \{\text{Log}(V2)\}^2] + [1.3483 \times \{\text{Log}(V2)\}^3] + [0.37073 \times \{\text{Log}(V2)\}^4] + [0.036284 \times \{\text{Log}(V2)\}^5] + \{\text{Log } R\} - [6.1434 \times \text{Log}(V1)] - [2.6286 \times \{\text{Log}(V1)\}^2] - [1.3483 \times \{\text{Log}(V1)\}^3] - [0.37073 \times \{\text{Log}(V1)\}^4] - [0.036284 \times \{\text{Log}(V1)\}^5] = 0,$$

where
V1=desired voltage across said first transistor=VDD×VR/(VR+1)
V2=desired voltage across said second transistor=VDD/(VR+1)
VR=V1/V2
VDD=applied power source voltage
R=said ratio of said second transistor gate electrode area to said first transistor gate electrode area.

2. A method of designing a circuit for dividing voltage, comprising the steps of:
providing a first transistor including a gate electrode having an area, a source, and a drain; and
providing a second transistor including a gate electrode having an area, a source, and a drain;
selecting said first transistor gate electrode area and said second transistor gate electrode area according to a predetermined ratio between the areas to provide a desired voltage division, wherein said ratio is calculated using the following non-linear function solved by numerical iteration $$[6.1434 \times \text{Log}(V2)] + [2.6286 \times \{\text{Log}(V2)\}^2] + [1.3483 \times \{\text{Log}(V2)\}^3] + [0.37073 \times \{\text{Log}(V2)\}^4] + [0.036284 \times \{\text{Log}(V2)\}^5] + \{\text{Log } R\} - [6.1434 \times \text{Log}(V1)] - [2.6286 \times \{\text{Log}(V1)\}^2] - [1.3483 \times \{\text{Log}(V1)\}^3] - [0.37073 \times \{\text{Log}(V1)\}^4] - [0.036284 \times \{\text{Log}(V1)\}^5] = 0,$$

where
V1=desired voltage across said first transistor=VDD×VR/(VR+1)
V2=desired voltage across said second transistor=VDD/(VR+1)
VR=V1/V2
VDD=applied power source voltage
R=said ratio of said second transistor gate electrode area to said first transistor gate electrode area; and
joining said second transistor gate electrode with said first transistor source and said first transistor drain.

\* \* \* \* \*